United States Patent
Hsieh et al.

(10) Patent No.: US 10,998,399 B2
(45) Date of Patent: May 4, 2021

(54) POWER SEMICONDUCTOR DEVICE

(71) Applicant: Infineon Technologies AG, Neubiberg (DE)

(72) Inventors: Alice Pei-Shan Hsieh, Munich (DE); Philip Christoph Brandt, Oberhaching (DE); Holger Huesken, Munich (DE); Viktoryia Lapidus, Munich (DE); Manfred Pfaffenlehner, Munich (DE); Frank Dieter Pfirsch, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/456,122

(22) Filed: Jun. 28, 2019

(65) Prior Publication Data

US 2020/0013854 A1    Jan. 9, 2020

(30) Foreign Application Priority Data

Jul. 5, 2018   (DE) .......................... 102018116332.0

(51) Int. Cl.
  *H01L 29/06*   (2006.01)
  *H01L 29/40*   (2006.01)
(52) U.S. Cl.
  CPC ...... *H01L 29/0623* (2013.01); *H01L 29/0638* (2013.01); *H01L 29/404* (2013.01)
(58) Field of Classification Search
  CPC ............... H01L 29/0623; H01L 29/402; H01L 29/0638; H01L 29/7811
  See application file for complete search history.

(56) References Cited

U.S. PATENT DOCUMENTS

| | | | |
|---|---|---|---|
| 9,530,836 B2 * | 12/2016 | Senoo | ................. H01L 29/7397 |
| 2008/0169526 A1 | 7/2008 | Wakimoto et al. | |
| 2014/0197476 A1 | 7/2014 | Shimatou | |
| 2017/0271440 A1 | 9/2017 | Tanaka et al. | |

FOREIGN PATENT DOCUMENTS

DE   19741167 A1   4/1999

* cited by examiner

*Primary Examiner* — Quoc D Hoang
(74) *Attorney, Agent, or Firm* — Murphy, Bilak & Homiller, PLLC

(57) ABSTRACT

A power semiconductor device includes a semiconductor substrate with an edge termination region between an active region and a lateral rim. Non-metallic electrodes extend in the edge termination region on a front side of the substrate, and include at least three spaced apart non-metallic electrodes. One non-metallic electrode is an inner non-metallic electrode having an inner edge. Another non-metallic electrode is an outer non-metallic electrode having an outer edge. The shortest distance between the inner edge of the inner non-metallic electrode and the outer edge of the most non-metallic electrode is defined as distance p. Each non-metallic electrode is electrically connected to a respective doping region of the substrate by at least two respective metallic plugs each extending through a respective first opening formed in an electrically insulating bottom layer. The shortest distance d between any two metallic plugs of different non-metallic electrodes is larger than the distance p.

19 Claims, 6 Drawing Sheets

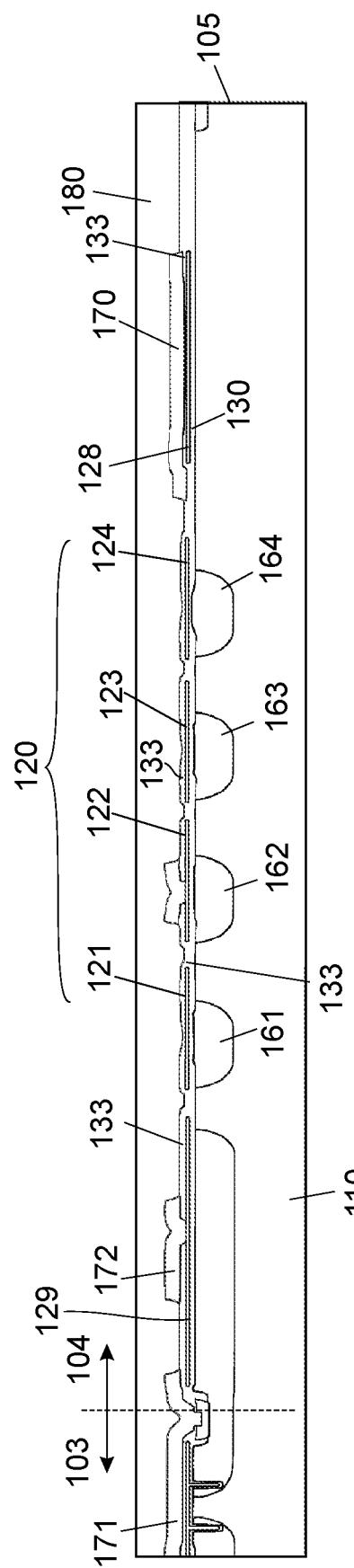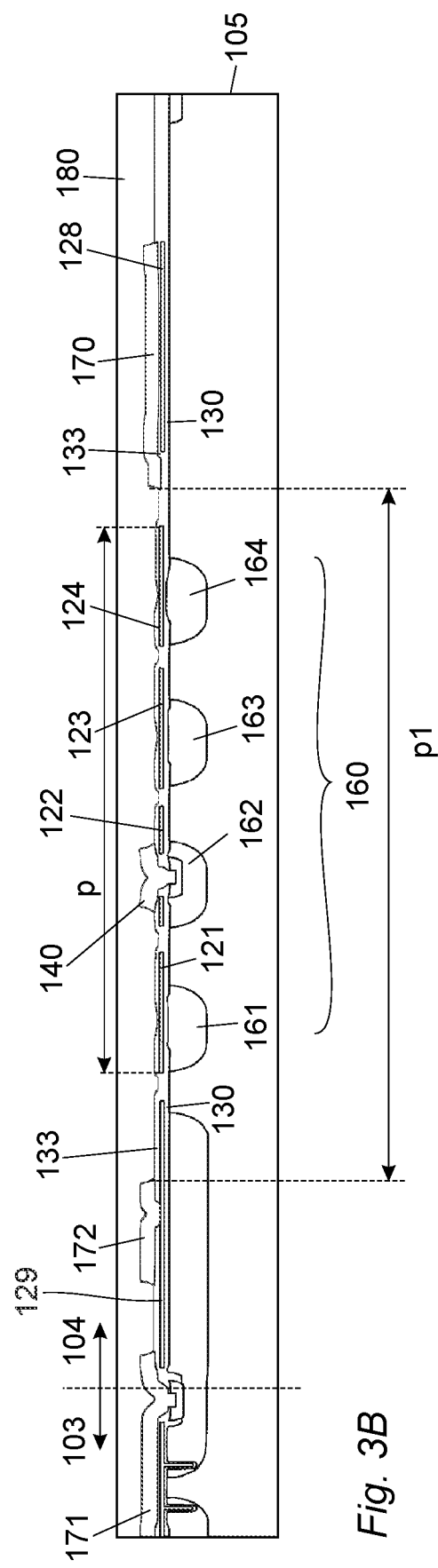
Fig. 3A
Fig. 3B

POWER SEMICONDUCTOR DEVICE

TECHNICAL FIELD

Embodiments described herein relate to power semiconductor devices having a reduced metal covering in the edge termination region.

BACKGROUND

Power semiconductor devices may be exposed to harsh conditions. For example, industrial power modules comprising power semiconductor devices may be subjected to changing environmental exposure conditions in some applications. Illustrative examples are employment of power semiconductor devices at non-weather protected locations for renewables wind or solar applications. In such cases, customers need to install the power modules such as inverters in a harsh environment with high humidity. Some customers desire humidity rugged products as they do not want, or are not able, to protect their application systems against these environmental conditions.

Stricter reliability qualification tests such as High Voltage High Humidity High Temperature Reverse Bias (HV-H3TRB) may be used for qualifying technologies or products for humid environment usage. To pass those tests, the power semiconductor devices needs to be suitable protected against environmental conditions for many years since power semiconductor devices are installed for a long time.

In view of the above, there is need for further improvement.

SUMMARY

According to an embodiment, a power semiconductor device includes a semiconductor substrate having a central area defining an active region of the semiconductor device and a peripheral area between the central area and a lateral rim of the semiconductor substrate, wherein the peripheral area defines an edge termination region of the semiconductor device. A plurality of non-metallic electrodes extends in the edge termination region on a front side of the semiconductor substrate, wherein the plurality of non-metallic electrodes includes at least three non-metallic electrodes being spaced apart from each other, wherein one of the non-metallic electrodes is an inner non-metallic electrode having an inner edge and another one of the non-metallic electrodes is an outer non-metallic electrode having an outer edge, wherein the shortest distance between the inner edge of the inner non-metallic electrode and the outer edge of the most non-metallic electrode is defined as distance p. An electrically insulating bottom layer is arranged between the semiconductor substrate and the plurality of non-metallic electrodes. Each of the non-metallic electrodes is electrically connected to a respective doping region of the semiconductor substrate by at least two respective metallic plugs each extending through a respective first opening formed in the electrically insulating bottom layer, wherein the shortest distance d between any two of the metallic plugs of different non-metallic electrodes is larger than the distance p. An electrically insulating cover layer on and in contact with an upper surface of the plurality of non-metallic electrodes.

According to an embodiment, a power semiconductor device, includes a semiconductor substrate with a central area defining an active region of the semiconductor device and a peripheral area between the central area and a lateral rim of the semiconductor substrate, wherein the peripheral area defines an edge termination region of the semiconductor device, the edge termination region comprising straight portions and curved portions. A plurality of non-metallic electrodes is formed in the edge termination region on a front side of the semiconductor substrate, wherein the plurality of non-metallic electrodes extends in the straight portions and the curved portions of the edge termination region. An electrically insulating bottom layer is arranged between the semiconductor substrate and the plurality of non-metallic electrodes. Each of the plurality of non-metallic electrodes is electrically connected to a respective doping region, which is formed in the semiconductor substrate in the edge termination region, by a respective metallic plug, wherein at least one of the metallic plugs of each of the non-metallic electrodes is formed in any of the straight portions of the edge termination region. An electrically insulating cover layer is on and in contact with an upper surface of the plurality of non-metallic electrodes.

According to an embodiment, a power semiconductor device, includes a semiconductor substrate having a central area defining an active region of the semiconductor device and a peripheral area between the central area and a lateral rim of the semiconductor substrate, the peripheral area defines an edge termination region of the semiconductor device. At least an inner non-metallic electrode has an inner edge and at least an outer non-metallic electrode has an outer edge, wherein the shortest distance between the inner edge of the inner non-metallic electrode and the outer edge of the outer non-metallic electrode is defined as distance p, and wherein the inner non-metallic electrode and the outer non-metallic electrode are being separate to and spaced apart from each other. An electrically insulating bottom layer is arranged between the semiconductor substrate and the non-metallic electrodes. The non-metallic electrodes are electrically connected to respective doping regions of the semiconductor substrate by at least five respective metallic plugs each extending through a respective first opening formed in the electrically insulating bottom layer, wherein the shortest distance d between any two of the metallic plugs is larger than the distance p. An electrically insulating cover layer is on and in contact with an upper surface of the non-metallic electrodes.

Those skilled in the art will recognise additional features and advantages upon reading the following detailed description, and upon viewing the accompanying drawings.

BRIEF DESCRIPTIONS OF THE DRAWINGS

The components in the figures are not necessarily to scale, instead emphasis being placed upon illustrating the principles of the invention. Moreover, in the figures, like reference signs designate corresponding parts. In the drawings:

FIGS. 3A and 3B illustrate cross-sectional view along respective lines indicated in FIG. 2.

DETAILED DESCRIPTION

In the following detailed description, reference is made to the accompanying drawings, which form a part hereof, and in which are shown by way of illustration specific embodiments in which the invention may be practiced. In this regard, directional terminology, such as "top", "bottom", "front", "back", "leading", "trailing", "lateral", "vertical", "under", "below", "lower", "over", "upper" etc., is used with reference to the orientation of the Figure(s) being described. Because components of embodiments can be positioned in a number of different orientations, the directional terminology is used for purpose of illustration and is in no way limiting. It is to be understood that other embodiments may be utilised and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

As used herein, the terms "having", "containing", "including", "comprising" and the like are open ended terms that indicate the presence of stated elements or features, but do not preclude additional elements or features.

In this specification, a second surface of a semiconductor substrate is considered to be formed by the lower or backside surface while a first surface is considered to be formed by the upper, front or main surface of the semiconductor substrate. The terms "above" and "below" as used in this specification therefore describe a relative location of a structural feature to another structural feature with consideration of this orientation.

The terms "electrical connection" and "electrically connected" describes an ohmic connection between two elements.

The embodiments described below refer to power semiconductor device, i.e. a semiconductor device capable of switching and blocking large currents and voltages. The power semiconductor device is simply referred to as power device hereinafter.

A power semiconductor module typically includes at least two power devices which are connected to form a circuit. An exemplary example is a bridge circuit for controlling an electric motor.

Figure 1:
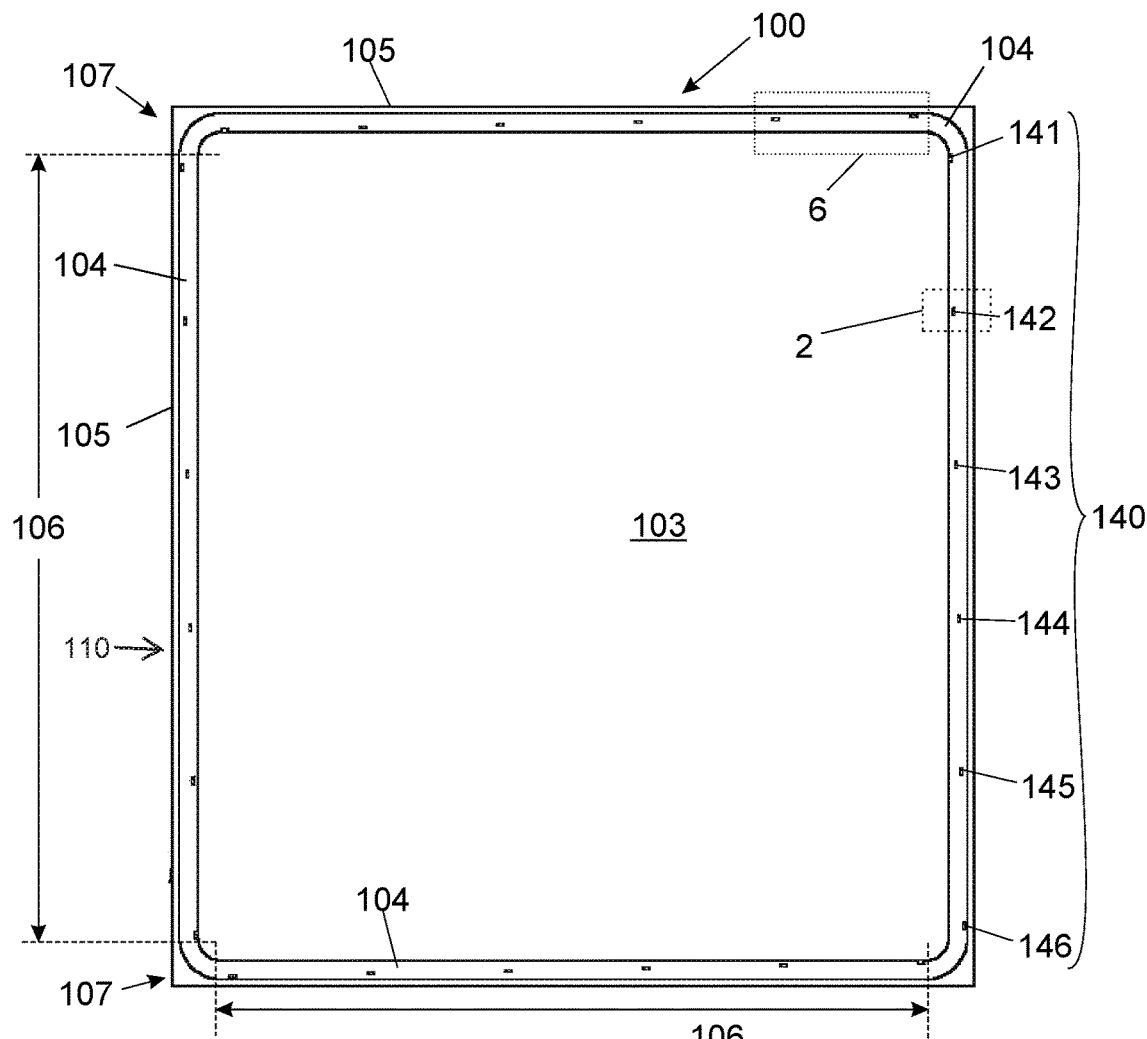
FIG. 1 illustrates a plan view onto a semiconductor substrate of a semiconductor device according to an embodiment.

FIG. 1 illustrates a plane view onto a front side 111 of the semiconductor substrate 110 of a power device 100 in accordance with one or more embodiments. The semiconductor substrate 110 can be made of any semiconductor material suitable for manufacturing semiconductor components. Examples of such materials include, without being limited thereto, elementary semiconductor materials such as silicon (Si), group IV compound semiconductor materials such as silicon carbide (SiC), and binary III-V semiconductor materials such as gallium nitride (GaN). When combining two different semiconductor materials a heterojunction semiconductor material is formed. Examples of heterojunction semiconductor materials include, without being limited thereto, silicon ($Si_xC_{1-x}$) and SiGe heterojunction semiconductor material. For power semiconductors currently mainly Si, SiC and GaN materials are used. In exemplary embodiments, the semiconductor substrate 110 is Si without being limited thereto.

The semiconductor substrate 110 includes a large central area defining an active region 103 of the power device. An edge termination region 104 is formed in a peripheral area of the semiconductor substrate 110 between the active region 103 and a lateral rim 105 of the semiconductor substrate 110.

The active region 103 of the semiconductor device 100 describes that region of a semiconductor device which is designed to control the load current through the semiconductor device. For example, a Power-FET (power field-effect transistor) includes a plurality of so-called active transistor cells which are all arranged within the active region 103. The active transistor cells can be rendered conductive when a suitable voltage is applied to the gate electrodes of the active transistor cells. Otherwise, the active transistor cells block the applied voltage.

Different thereto, the edge termination region 104 is provided for managing the large electric field occurring between the front side 111 and a not shown backside of the semiconductor substrate 110. During blocking mode of the power device 100, a large voltage drop occurs between the front side 111 and the backside of the semiconductor substrate 110. The thickness of the semiconductor substrate 110 and its doping are adapted to withstand the large voltage. However, the lateral rim 105 of the semiconductor substrate 110 typically cannot tolerate high blocking voltages, for example due to crystal defects at the lateral rim 105. The edge termination region 104 is therefore provided to ensure that the electrical field strength at the lateral rim 105 is significantly reduced during blocking mode so that no breakdown occurs.

Figure 2:
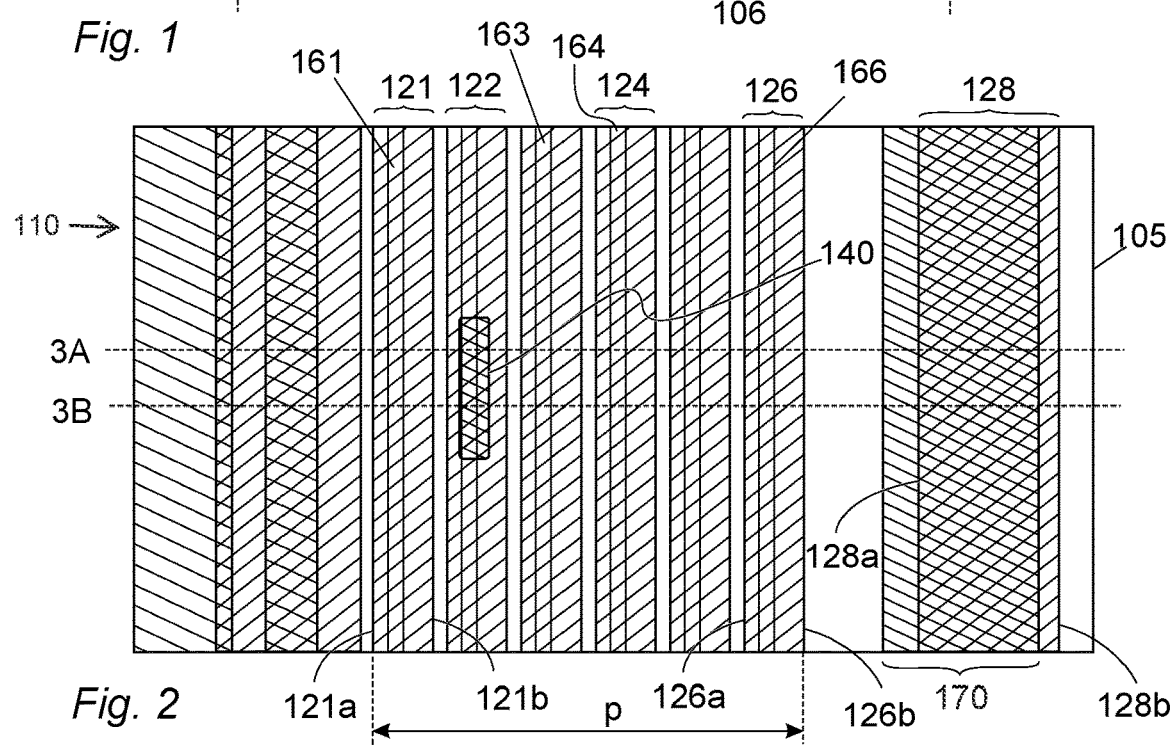
FIG. 2 illustrates an enlarged portion of FIG. 1.

Different measures are suggested for reducing the electrical field strength in the edge termination region 104. One exemplary measure is the use of so-called field rings in combination with field plates which have a ring-like shape and are formed to surround the active region 103. The field rings are doping regions formed in the semiconductor substrate 110 in the edge termination region 104. The field plates are electrodes formed above and in ohmic connection with the field rings. FIG. 2 shows a portion of the edge termination region 104 of the embodiment of FIG. 1 which includes six field rings 161 to 166 and six field plates 121 to 126. Each of the field plates 121 to 126 and the field rings 161 to 166 completely surrounds the active region 103 when seen in plane projection onto the front side 111 of the semiconductor substrate 110. The field plates 121 to 126 and the field rings 161 to 166 have an increasing distance from the active region 103. Therefore, the first field ring 161 and the first field plate 121 are arranged closest to the active region 103, while the sixth field ring 166 and the sixth field plate 166 are arranged most remote from the active region 103 and closest to the lateral rim 105.

According to an embodiment, each of the field plates 121 to 126 forms a respective non-metallic electrode. Each of the non-metallic electrodes 121 to 126 is separate to and spaced from its neighbouring non-metallic electrode. For example, the non-metallic electrodes 121 to 126 may not be in ohmic connection with each other so that each can be at a different electrical potential during operation of the power semiconductor device.

In the present embodiment shown in FIGS. 1 and 2, the number of field rings and field plates is six. This is, however, only an exemplary number, and the number of field rings and field plates may be higher or lower than six depending on the rated blocking voltage of the power device 100. According to an embodiment, the number of field plates, i.e. the number of non-metallic electrodes, may be at least two, particularly at least three, or at least four.

According to an embodiment, the non-metallic electrodes 120 may have a ring-like shape and completely surrounds the active region 103 when seen in a plan projection onto a front side 111 of the semiconductor substrate 110.

As illustrated in FIG. 1, the edge termination region 104 may include straight portions 106 and curved portions 107 which connects the straight portions 106 at the respective corners of the semiconductor substrate 110. Each of the field plates 120 and the field rings 160 also may include straight portions and curved portions which are arranged in the respective straight portions 106 and the curved portions 107 of the edge termination region 104.

FIG. 2 shows an enlarged section, marked by "2" in FIG. 1, of a straight portion 106 of the edge termination region 104 with respective straight portions of the field plates and the field rings.

As illustrated in FIG. 2, the field plates 120 may be closely spaced from each other. Each of the field plates 120 may be at a different electrical potential when the power device is in the blocking mode. This means that a voltage drop occurs between adjacent field plates resulting in an electrical field distribution in lateral direction from the active region 103 to the lateral rim 105. For example, hydroxide ($OH^-$) and hydronium ($H_3O^+$) or hydrogen ($W$) ions of self-ionised or decomposed water, which may be absorbed in insulation layers or passivation layers encapsulating the semiconductor substrate 110, may migrate under the influence of the lateral electrical field. The migrating irons may create a pH gradient which can initiate corrosion of field plates formed from metal. The corrosion may be enhanced in the presence of further contaminations such as $Na^+$, $K^+$, or $Cl^-$-ions which inevitably occur during manufacturing of the power device, the assembly process and/or module packages processes.

Migration of ions is particularly enhanced in high voltage devices such as power devices for rated blocking voltages of for example 1200 V. If such power devices are subjected to reliability qualification tests such as the HV-H3TRB test, significant migration of ions occurs leading to an enhanced corrosion of metal-based field plates. The increased corrosion of the metal-based field plates may eventually lead to a malfunction of the power device when the power device is not any more capable of withstanding the rated blocking voltage.

In addition to the initiated migration of self-ionised water molecules, the high electrical field may also induce additional ionisation or decomposition of water, thus leading to further migration and increase of pH gradient.

In addition to the decomposition of water, migration of already presented metal ion contaminations is promoted by positively biased electrodes (e.g., IGBT collector, diode cathode) releasing mobile metal ions which then migrate in electrolytes, such as solid electrolytes, to precipitate at the negatively biased electrode (e.g., IGBT emitter, diode anode). The precipitated metal ions may form dendritic structures at the negatively biased electrodes leading to locally enhanced electrical fields.

To avoid or at least significantly reduce corrosion in the edge termination region 104, non-metallic electrodes 120 may be used as, for example, field plates according to an embodiment. To provide a reliable ohmic connection between the respective non-metallic electrode and the respective field ring, small metallic plugs are used, which provides a local and enhanced ohmic connection. The metal plugs 140 are distributed at significant distance from each other so that the electrical field formed between metal plugs 140 of adjacent non-metallic electrodes is significantly reduced due to the enlarged distance.

According to an embodiment, a plurality of non-metallic electrodes 120 extends in the edge termination region 104 on the front side 111 of the semiconductor substrate 110. The plurality of non-metallic electrodes 120 includes an inner non-metallic electrode 121 and an outer non-metallic electrode 126. The non-metallic electrodes 120 can form a group of field plates 120 with at least one inner non-metallic electrode (a most inner field plate) 121 and at least one outer non-metallic electrode (a most outer field plate) 126. The term "inner" and "outer" is defined relative to the active region 103 and the outer rim 105. An element arranged at a more outer position to another element is arranged closer to the outer rim 105 than the other element.

When referring to non-metallic electrodes in general, reference sign 120 is used. The non-metallic electrodes 120 may include at least an inner and an outer non-metallic electrode 121, 122. In some embodiments, the non-metallic electrodes 120 includes two, three, four or six non-metallic electrodes 121 to 126. When reference is made to a specific non-metallic electrode, the respective reference sign is used.

As illustrated in FIG. 2, the inner non-metallic electrode 121 of the group of the field plates 120 has an inner, or most inner, edge 121a. The outer non-metallic electrode 126 of the group of the field plates 120 has an outer, or most outer, edge 126b. Each of the non-metallic electrodes 121 to 126 has an inner and an outer edge. The shortest distance between the inner edge 121a of the most inner non-metallic electrode 121 of the group of the field plates and the outer edge 126b of the most outer non-metallic electrode 126 of the group of the field plates is defined as distance p.

In the present embodiment, the power device includes a group of field plates 120. Optionally, the power device can also include a channel stopper electrode 128, arranged between the most outer field plate 126 and the outer rim 105. The channel stopper electrode 128 can also be a non-metallic electrode and is also referred to as polysilicon ring if the main material of the channel stopper electrode 128 is polysilicon. If a channel stopper electrode 128 is present, the distance p can also be defined as the shortest distance between the inner edge 121a of the most inner field plate 121 and an outer edge 128b of the channel stopper electrode 128. The channel stopper electrode 128 also has an inner edge 128a facing the outer edge 126b of the most outer field plate 126.

The power device further includes an electrically insulating bottom layer 130 arranged between the semiconductor substrate 110 and the plurality of non-metallic electrodes 120. Each of the first and the second non-metallic electrode 121, 122 is electrically connected to a respective doping region 161, 162 of the semiconductor substrate 110 by a respective metallic plug 141, 142 extending through a respective first opening 131 formed in the electrically insulating bottom layer 130. The shortest distance d between the metallic plugs 141, 142 is at least twice as large as the distance p between the inner edge 121a of the most inner non-metallic electrode 121 of the group of the field plates and the outer edge 126b of the most outer non-metallic electrode 126 of the group of the field plates 120. The doping regions 161, 162 form respective field rings in the present embodiment. For example, the doping regions 161, 162 can be of p-type and form respective pn-junctions with surrounding portions of the semiconductor substrate 110. Typically, the doping regions 161, 162, i.e. the field rings 161, 162, form pn-junctions with an n-doped drift region of the semiconductor substrate 110. The n-type conductivity may be referred to as first conductivity while the p-type conductivity may be referred to as second conductivity type.

As shown in FIG. 2, the field rings 160 are also spaced from each other at the given pitch p in this embodiment. The pitch p of the field rings 160 may also vary in other embodiments. Similar to the above, when reference is made to any of or to all of the field rings, or to any of or to all of the doping regions, reference sign 160 is used, whereas reference sign 161 to 166 is used when reference is made to a specific one of the field rings or doping regions.

As with the doping regions and the non-metallic electrodes, reference sign 140 is used when reference is made to any or all plugs whereas reference signs 141 to 146 are used when reference is made to a specific one of the plugs 140.

According to an embodiment, each of the non-metallic electrodes 120 is arranged above and extends along a respective one of the doping regions 160, wherein each doping region 160 is of a second conductivity type and forming a respective pn-junction with a drift region of a first conductivity type.

An electrically insulating cover layer 133 is arranged on and in contact with an upper surface of the plurality of non-metallic electrodes 120. The electrically insulating cover layer 133 protects the upper surface of the non-metallic electrodes 120.

The electrically insulating cover layer 133 is hereinafter simply referred to as cover layer 133 while the electrically insulating bottom layer 130 is simply referred to as bottom layer. The bottom layer may include at least one of a field oxide layer and a gate dielectric layer, or a combination of both.

According to an embodiment, the non-metallic electrodes 120 are formed of highly doped polysilicon material. Since the polysilicon material may come in direct contact with the doping regions 160 at selected areas, the polysilicon material of the non-metal electrodes is of the same conductivity type as the doping regions 160.

According to an embodiment, no-metal structures are formed on and in contact with the respective non-metallic electrodes 121, 122 except for the small-sized metallic plugs 140. This measure significantly reduces the amount of metal in the edge termination region 104 and thus reduces the likelihood of corrosion induced by, or enhanced by, electron migration of contaminating ions.

The distribution of the plugs 140 may be best shown in FIG. 1. Except for the small-sized plugs 140, no metal structure is arranged on and in contact with the non-metallic electrodes such as the field plates 120 in the edge termination region 104. In each of the straight portions 106 of the edge termination region 104, a single plug 140 is used for providing an low-ohmic contact between a respective non-metallic electrode 120 and a respective doping region 160. Since the edge termination region 104 includes four straight portions 106, each non-metallic electrode 120, for example each field plate, is electrically connected to the doping region 160, for example a field ring, arranged below and running parallel to the non-metallic electrode 120 by four metal plugs 140.

FIG. 1 also shows that no metal plugs are formed in the curved portions 107. The curved portions 107 are therefore free of metal at least in those regions where the non-metallic electrodes 120 are formed. A metal ring may be formed next to the lateral rim 105. Such a metal ring does not cover, and is not formed above, the non-metallic electrodes and may function as conductive structure for the so-called channel stopper 128, also referred to as non-metallic channel stopper 128.

According to an embodiment, the bottom layer 130 may be a thermally grown oxide layer. The oxide layer may have a varying thickness and may be formed by a multistep process by first protecting the front side 111 of the semiconductor substrate 110 at portions where no oxide layer shall be formed, and subjecting the remaining exposed portions of the front side 111 of the semiconductor substrate 110 to an oxidising atmosphere at high temperatures. The density of the thus formed oxide layer can be varied by adjusting the temperature and the composition of the oxidising atmosphere. Since the oxide layer is only locally formed where the front surface 111 is exposed, the technique is referred to as LOCOS (Local Oxidation Of Silicon). After removing the protection formed for masking portions of the semiconductor substrate which were not intended to be oxidized, the thus exposed areas may be subjected to a second oxidation step, forming a second thermal oxide layer on the exposed areas which may be thinner than the first portion of the bottom layer. The thickness of the bottom layer 130, except for the mentioned second portion, can be between 500 nm and 1600 nm. A typical example is 1000 nm.

The cover layer 133 may comprise an insulating material formed, for example, by chemical deposition of oxide material such as borophosphosilicate glass (BPSG). The thickness of the cover layer 133 can be between 500 nm and 2000 nm. A typical example is 1200 nm.

With reference to FIGS. 3A and 3B, further details of the present embodiment are described. FIG. 3A shows a cross-sectional view along line 3A in FIG. 2 while FIG. 3B shows a cross-sectional view along line 3B in FIG. 2. FIGS. 3A and 3B illustrate a portion of the semiconductor substrate 110, approximately from the transition between the active region 103 and the edge termination 104, through the edge termination 104 up to the lateral rim 105. For ease of illustration, only four field plates (non-metallic electrodes) 121 to 124 are shown.

The active region 103 is basically covered with a large front metallization 171. Depending on the actual type of the power device, the front metallization 171 can be an anode metallization in case of a diode, a source metallization in case of a Power-FET, or an emitter electrode in case of an IGBT. The processes used for forming the front metallization 171 may also be used, according to an embodiment, for forming the metallic plugs 140. The metallic plugs 140 have a unique structure with typically spaced apart regions for connecting the respective non-metallic electrode 120 and the respective doping region 160. Metallic plugs, or connections, of similar structure can therefore also be found in the active region 103, or in the edge termination region 104 to connect other structures. Using the same manufacturing processes reduces the amount of needed steps and thus reduces the manufacturing costs.

The location of the regions where the metal plugs 140 contact the doping regions 160 or the non-metallic electrodes 120 can be freely chosen. It is therefore possible to form metallic plugs 140 of different size and location. Furthermore, the two different contact regions, i.e. a contact region for contacting the semiconductor substrate 110 or any specific doping region and a contact region for contacting the non-metallic electrodes, allows to form different electrical contact schemes. Therefore, different metal structures such as the front metallization 171 and the metallic plugs 140 can be formed by the same processes. In addition to that, it is not needed that each metal structure includes both of the different contact regions.

As an example, FIGS. 3A and 3B illustrate a gate runner metal ring 172 at the transition between the active region 103 and the edge termination region 104. The gate runner is electrically connected to a gate electrode structure formed together with the non-metallic electrode 120, as illustrated in FIG. 3B. The gate runner metal ring 172 only contacts the gate electrode structure but not any doping region. A non-metallic gate runner 129 is arranged below the gate runner metal ring 172. The non-metallic gate runner 129 and the gate runner metal ring 172 form together a gate runner. Both the non-metallic gate runner 129 and the gate runner metal ring 172 are electrically connected with each other through connections formed according to the metal plugs 140. In a typical embodiment, the connections between the non-metallic gate runner 129 and the gate runner metal ring 172 are formed by the gate runner metal ring 172 through an opening of the insulating cover layer 133 which also covers the non-metallic gate runner 129. The non-metallic gate runner 129 is electrically insulated from the semiconductor substrate 110 by the insulating bottom layer 130. The non-metallic gate runner 129 is also referred to as gate runner poly ring if the main material of the non-metallic gate runner 129 is polysilicon.

A further example is a metallic channel stopper ring 170 formed at a lateral end of the edge termination region 104 closest to the lateral rim 105. The metallic channel stopper ring 170 also connects, from above, a channel stopper electrode 128.

Although FIGS. 3A and 3B illustrates embodiments with large metal structures, such as the metallic channel stopper ring 170, in addition to the metal plugs 140 in the edge termination, other embodiments do not include large metal structures but only the metallic plugs 140. Hence, no metal structures are arranged on the non-metallic electrodes 120, and on optional other electrode structures, in the edge termination region 104 except for the metal plugs 140.

For further protection, a passivation layer 180 can be provided on the metal plugs 140 and the cover layer 133. Typically, the passivation layer 180 may be an electrically insulating layer made of an organic material. Different thereto, the bottom layer 130 and the cover layer 133 may be made of inorganic material.

Figure 5A:
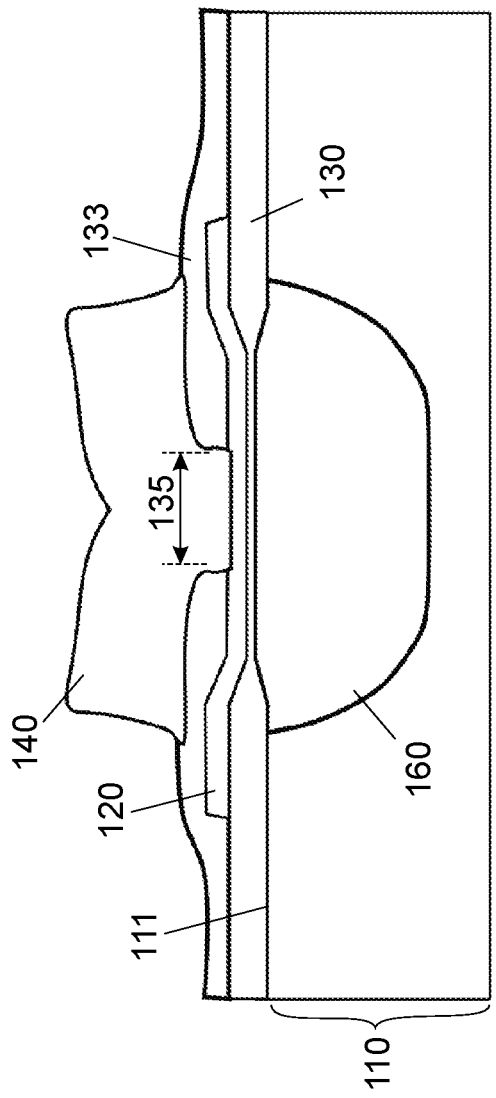
FIGS. 5A and 5B illustrate cross-sectional view along respective lines indicated in FIG. 4.
Figure 4:
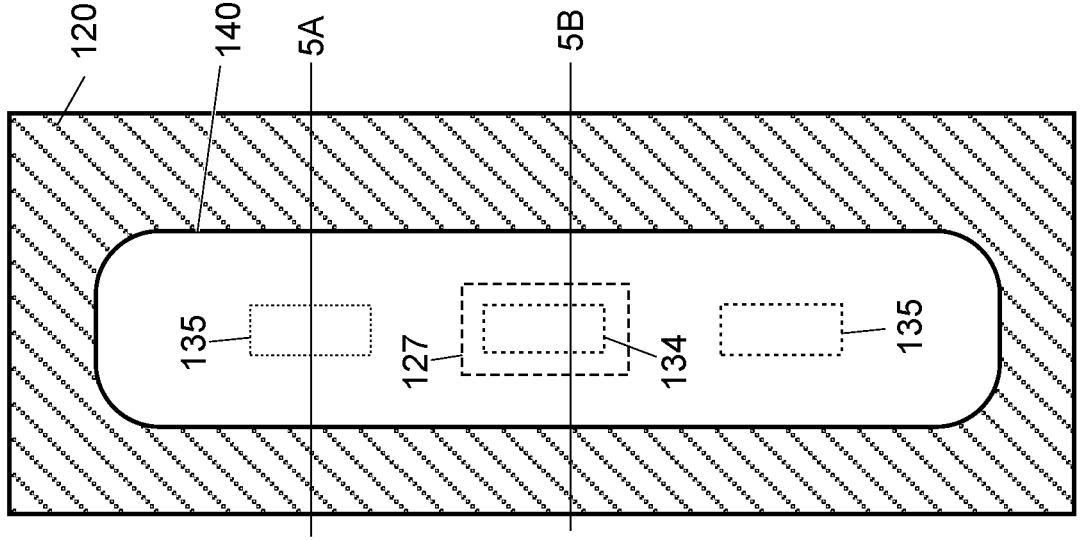
FIG. 4 illustrates a plan view onto a metallic plug.

Details of the metallic plugs 140 are described in connection with FIGS. 4, 5A and 5B. FIG. 4 illustrates a plan view onto a metallic plug 140. FIG. 5A illustrates a cross-sectional view along line 5A in FIG. 4, while FIG. 5B illustrates a cross-sectional view along line 5B in FIG. 4.

Figure 5B:
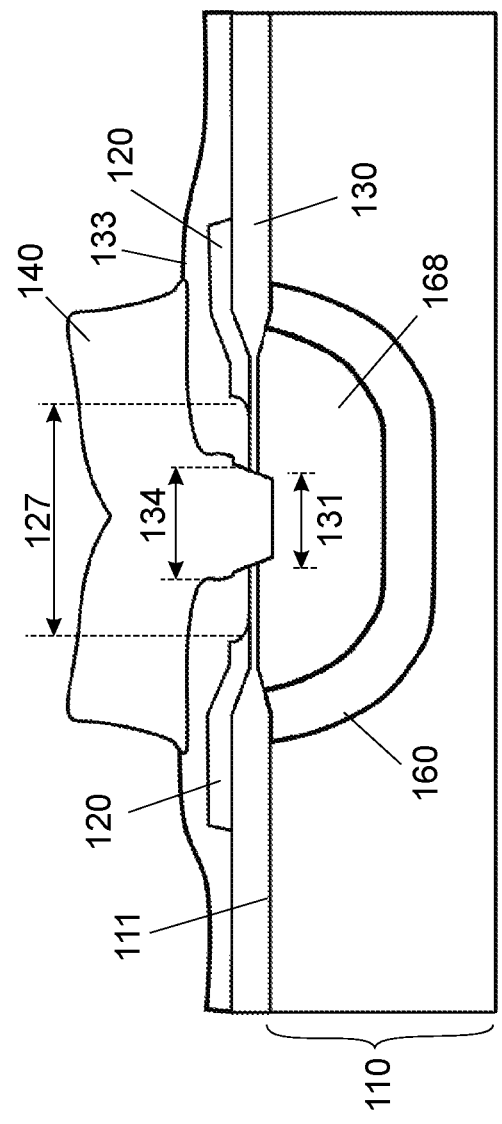

FIG. 5B shows a portion of the metallic plug 140 which makes direct contact to the doping region 160. A first opening 131 is provided in the bottom layer 130. An opening 127 of the non-metallic electrode 120 is formed above the first opening 131. The opening 127 of the non-metallic electrode 120 may be larger than the first opening 131 of the bottom layer 130. Therefore, the non-metallic electrode 120 may be retracted from the first opening 131 of the bottom layer 130.

A first opening 134 of the cover layer 133 is formed above the first opening 131 of the bottom layer 130. Since the cover layer 133 partially extends further inwardly than the rim of the opening 127 of the non-metallic electrode 120, the material of the non-metallic electrode 120 may be completely covered by the material of the cover layer 133. The first opening 131 of the bottom layer 130, the opening 127 of non-metallic electrode 120, and the first opening 134 of the cover layer 133 may form together a through hole. The non-metallic electrode 120 is not exposed within the through hole as the non-metallic electrode 120 is covered by the cover layer 133.

A portion of the metallic plug 140 extends through the through hole to reach the front side 111 of the semiconductor substrate 110 and to come into ohmic contact with the doping region 160.

Since the cover layer 133 is arranged between the non-metallic electrode 120 and the metallic plug 140 in the through hole, the non-metallic electrode 120 remains electrically insulated from the metallic plug 140 in the through hole. The contact region shown in FIG. 5B, i.e. where the metallic plug 140 is in direct contact with the doping region 160, is referred to as first contact region.

For improving the ohmic contact between the metallic plug 140 and the doping region 160, a highly doped contact region 168 can be provided. The contact region 168 has the same conductivity type as the doping region 160.

FIG. 5A illustrates a second contact region of the metallic plug 140. The second contact region is spaced from the first contact region. The distance between the first and the second contact regions can be freely chosen according to circumstance.

For the second contact region, the bottom layer 130 does not include an opening so that the non-metallic electrode 120 remains insulated from the doping region 160. The cover layer 133 includes a second opening 135, different to the first opening 134. The metallic plug 140 extends through the second opening 135 of the cover layer 133 to come into direct contact with an upper surface of the non-metallic electrode 120.

An ohmic contact between the doping region 160 and the electrode 120 is provided through the metallic plug 140. The metallic plug 140 extends from the first contact region to the second contact region.

Figure 6:
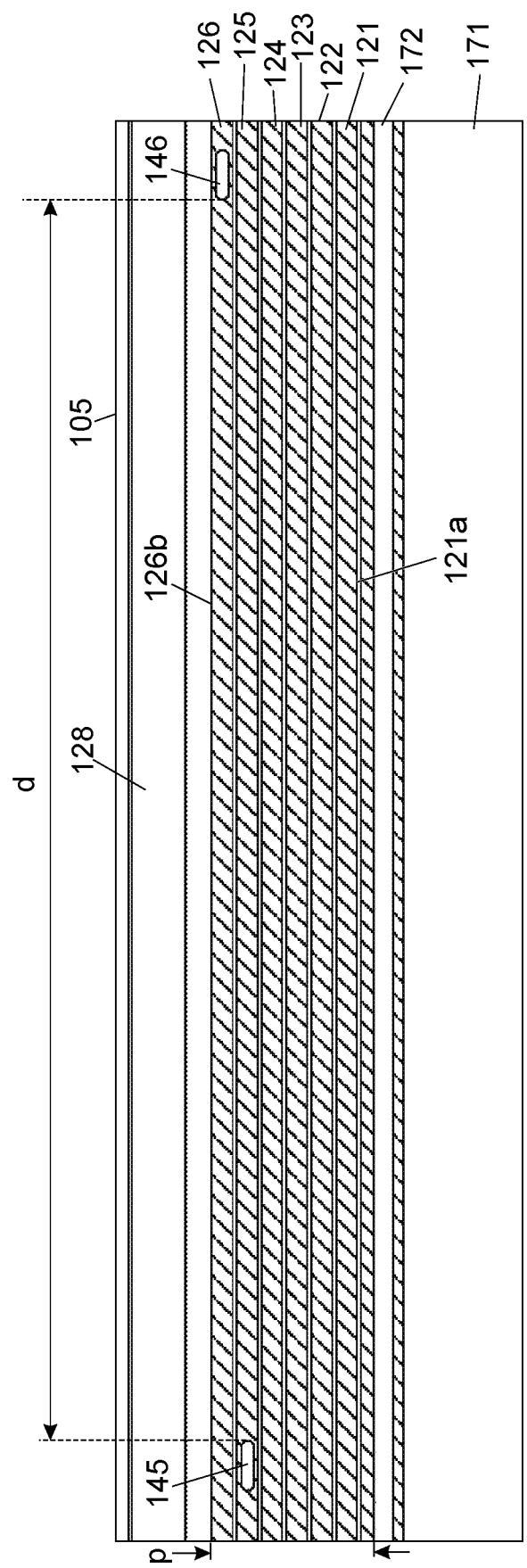
FIG. 6 illustrates an enlarged portion of the edge termination region according to an embodiment.

With reference to FIG. 6, the lateral distribution of the metallic plugs 140 is described. FIG. 6 illustrates an enlarged portion indicated by 6 in FIG. 1 and shows two metallic plugs 145, 146 of adjacent non-metallic electrodes 125, 126. All non-metallic electrodes 121, 122, 123, 124, 125, 126 are spaced from each other, for example at the same pitch. The shortest distance p between the inner edge 121a of the most inner non-metallic field plate 121 and the outer edge 126b of the most outer non-metallic field plate 126 is illustrated in FIG. 6.

Different thereto, the smallest distanced between the plugs 145, 146 of the respective adjacent non-metallic electrodes 125, 126 is significantly larger than the distance p. In the present embodiment, the distance d is at least two time, particularly at least three times as large, more particularly at least four times as large as the distance p. The distance d can be larger than the distance p at least by a magnitude as shown in FIG. 6.

The non-metallic electrodes 120 are at different electrical potential during blocking mode of the power device. The electrical potential lines run parallel to the longitudinal extension of the non-metallic electrodes 120. Hence, the electrical field lines are along a vertical line in FIG. 6. Due to the large additional spacing or offset in a direction along the extension of the non-metallic electrodes 120 resulting in the distance d, the effective electrical field strength between metallic plugs 144, 145 of the directly adjacent non-metallic electrodes 120 is significantly reduced to become very small. Therefore, electromigration of ions between the metallic plugs 140 is strongly reduced avoiding or at least significantly reducing corrosion induced by electromigration of ions.

The benefits of the disclosure can therefore be described as follows:

A termination design concept to overcome the high electric field at the metal structures and in the passivation layer 180 uses non-metallic field plates 120 such as polysilicon field plates in ohmic connection with field rings formed by the doping regions 160. In this termination concept, the field plates are made of, for example, a polysilicon layer and not a metal layer. Metal is only used to form electrical contacts, i.e. the metallic plugs 140, between the field rings, formed by p-doped doping regions 160, and the polysilicon field plate, i.e. the non-metallic electrodes 120. Different thereto, conventional approaches uses a metal line on top of each field plate that is going around the whole edge termination. Metal lines can corrode even when no or only a low electric field is present. This and the small distance of the metal lines from each other can lead to enhanced corrosion of the metal lines and failure of the device long term stress conditions with humidity.

An aspect of the disclosure is to minimize the amount of metal in the edge termination region 104 and to maximize the metal to metal distances in the edge termination region 104. Conventional approaches have not realized the importance of an increased metal-to-metal distance and the reduction of metal in the edge termination region 104 for reducing corrosion.

The approach described herein minimizes the metal area in the edge termination region 104 by using only small metallic plugs, particularly only one small metallic plug, of minimum size per straight portion 106 to connect a doping region 160, such as a p-doped ring, with the poly field plate formed by a non-metallic electrode 120. Metallic plugs in the curved portions 107 of the edge termination region 104, i.e. at the corner of the semiconductor substrate 110, are avoided. The metal-to-metal distance is increased by introducing an additional offset, in the direction of the longitudinal extension of the non-metallic electrodes 120, between the small metallic plugs 140.

The above concept can also be described as follow:

According to an embodiment, a semiconductor substrate 110 includes a central area defining an active region 103 of the semiconductor device 100 and a peripheral area between the central area and a lateral rim 105 of the semiconductor substrate 110. The peripheral area defines an edge termination region 104 of the semiconductor device 100, wherein the edge termination region 104 includes straight portions 106 and curved portions 107. A plurality of non-metallic electrodes 120 is formed in the edge termination region 104 on a front side 111 of the semiconductor substrate 110, wherein the plurality of non-metallic electrodes 120 extends in the straight portions 106 and the curved portions 107 of the edge termination region 104. An electrically insulating bottom layer 130 is arranged between the semiconductor substrate 110 and the plurality of non-metallic electrodes 120. Each of the plurality of non-metallic electrodes 120 is electrically connected to a respective doping region 160, 161, 162, which is formed in the semiconductor substrate 110 in the edge termination region 104, by a respective metallic plug 140, wherein the metallic plugs 140 are formed only in the straight portions 106 of the edge termination region 104. An electrically insulating cover layer 133 is on and in contact with an upper surface of the plurality of non-metallic electrodes 120.

The respective metallic plugs 140 are distributed within a respective straight portion 106 of the edge termination region 104 at a mutual distance which is larger than a pitch of the non-metallic electrodes 120.

According to an embodiment, the respective metallic plugs 140 are distributed within a respective straight portion 106 of the edge termination region 104 along a line which is inclined relative to a direction at which the non-metallic electrodes 120 are spaced from each other. This is perhaps best shown in FIGS. 1 and 7. The direction at which the non-metallic electrodes 120 are spaced from each other in the straight portion 106 of the edge termination region 104 is the vertical direction in FIG. 6. When virtually connecting the metallic plugs 140 shown in FIG. 1, a line is formed which is inclined relative to the direction at which the non-metallic electrodes 120 are spaced from each other. Due to a large additional offset in a direction along the longitudinal extension of the non-metallic electrode 120, the spacing between adjacent metallic plugs 140 is significantly increased.

Figure 7:
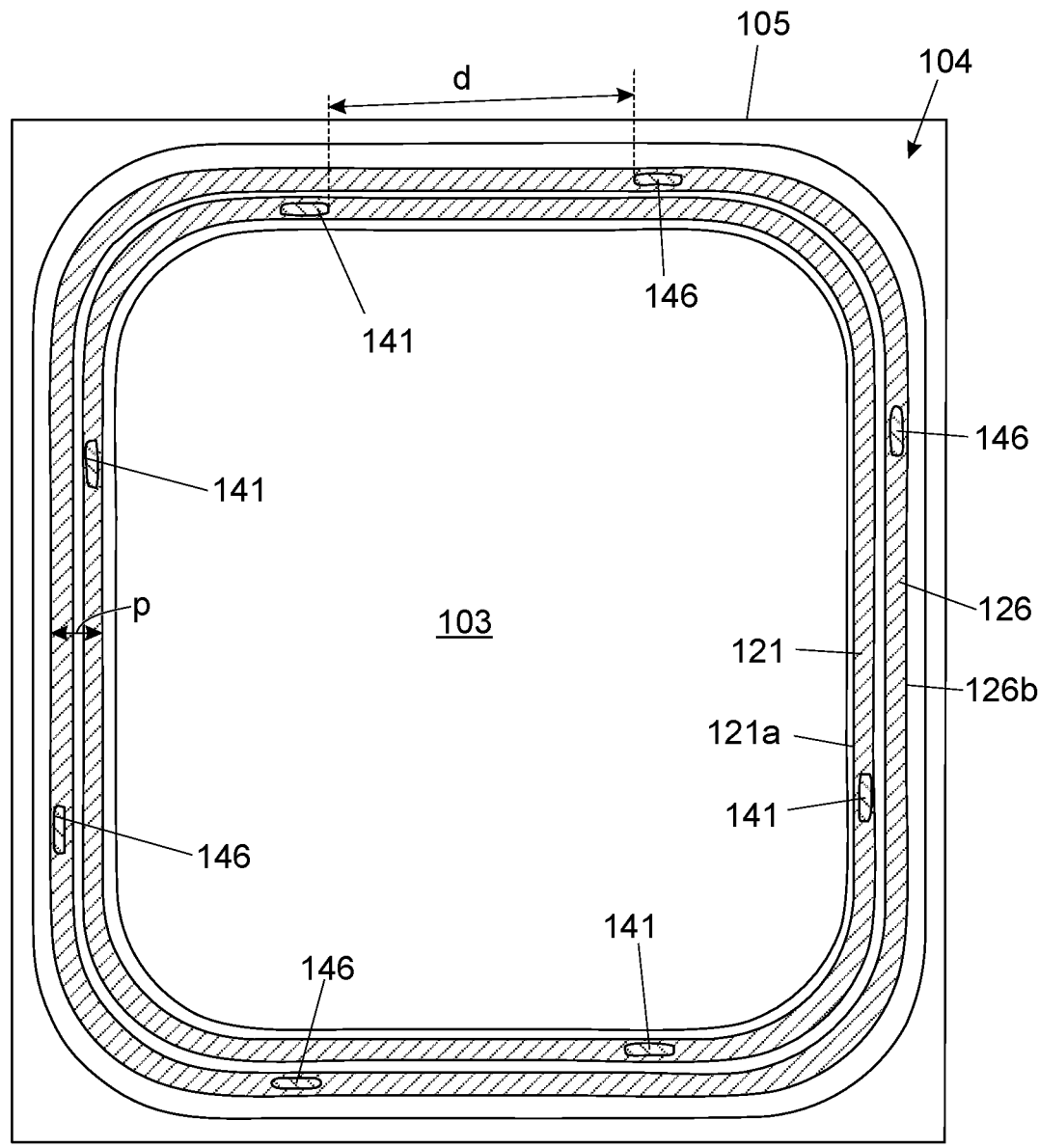
FIG. 7 illustrates a plan view onto a semiconductor substrate of a semiconductor device according to an embodiment.

According to an embodiment, the power device includes at least two field plates forming an inner and an outer non-metallic electrode 121, 126 as illustrated in FIG. 7. The at least two field plates 121, 126 can be electrically connected to respective doping regions by at least five metallic plugs 140. FIG. 7 illustrates four metallic plugs 140 per field plate 121, 126. Typically, at least one of the field plates 121, 126 is electrically contacted by at least three metallic plugs 140, particularly both or all of the field plates 121, 126 are electrically contacted by at least three metallic plugs 140 which are evenly distributed along the longitudinal extension of the respective field plate 121, 126. However, the metallic plugs 140 of different field plates 121, 126 are arranged relative to each other at a large distance d, which is at least two times, particularly at least four times, and more particularly at least six times as large as the shortest distance p.

Figure 8:
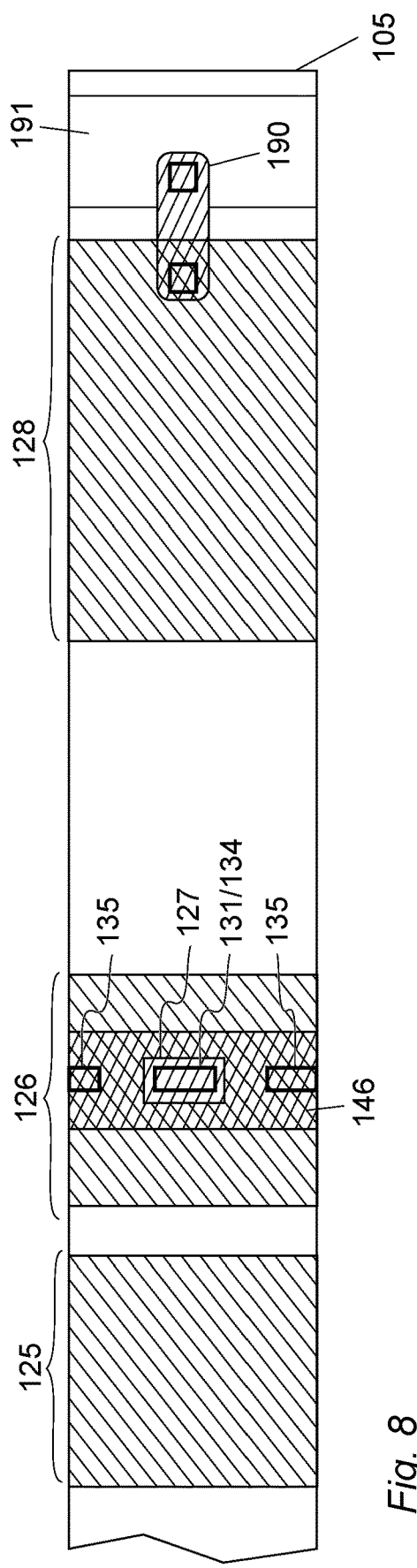
FIG. 8 illustrates a portion of the edge termination region with non-metallic electrodes and a channel stopper which does not employ a channel stopper ring made of metal.

FIG. 8 illustrates a further embodiment which additionally includes a channel stopper electrode 128, which is also a non-metallic electrode and which is disposed at the outer side relative to the most outer field plate 126, i.e. between the field plate 126 and the lateral rim 105 of the semiconductor substrate 110.

FIG. 8 also shows, in a plan view, a metallic plug 146 having one first contact region as illustrated in FIG. 5B and two second contact regions as indicated in FIG. 5A. The first contact region provides a direct contact between the metal plug 140 (146) and the doping region 160 (146), which is not shown in FIG. 8 and which is arranged below the field plate 120 (126). The location of the first opening 131 of the insulating bottom layer 130, first opening 134 of the insulating cover layer 133, and the opening of the field plate 120 (126) are shown. The second contact region provides a direct contact between the metallic plug 140 (146) and the field plate 120 (126). The location of the second opening 135 in the insulating cover layer 133 is indicated. The metallic plug 140 (146) extends through each of the respective openings as illustrated in FIGS. 5A and 5B, respectively.

A further metallic plug 190 is provided to electrically connect the channel stopper electrode 128 with a doping region 191.

According to an embodiment, the non-metallic electrodes are formed of a material which main component is polysilicon, particularly highly-doped polysilicon. Main component means more than 50 wt. % of the total weight of the non-metallic electrodes. According to an embodiment, the material of the non-metallic electrodes contains at least wt. % polysilicon, more particularly at least 85 wt. % polysilicon, such as at least 95 wt. % polysilicon. According to an embodiment, the non-metallic electrodes essentially consists of doped polysilicon. The term "essentially consist of" means that only unavoidable impurities can be additionally contained. The doping material for doping the polysilicon is not regarded as impurity.

According to an embodiment, the shortest distance d between any of the metallic plugs 140 of any two different non-metallic electrodes 120 is larger than the shortest distance p between the inner edge 121a of the most inner non-metallic electrode 121 and the outer edge 126b of the most outer non-metallic electrode 126. In a variation, the shortest distance d is larger than a shortest distance p1, indicated in FIG. 3B. The distance p1 is the shortest distance between two metallic electrode structures such as between two ring-like metallic electrodes which surrounds the active region 103. For example, the distance p1 can be defined as the shortest distance between an inner metallic ring-like electrode such as the gate runner 172 and an outer ring-like metallic electrode such as the channel stopper ring 170. This is illustrated in FIG. 3B. The non-metallic electrodes 120 are arranged between the inner metallic ring-like electrode, i.e. the gate runner 172, and the outer ring-like metallic electrode, i.e. the channel stopper ring 170.

According to an embodiment, the power device includes an inner ring-like metallic electrode structure 172, which surrounds the active region 103, a group of ring-like non-metallic electrodes 120 surrounding the ring-like metallic electrode 172, and an outer ring-like metallic electrode 170. The group of ring-like non-metallic electrodes 120 includes at least two separate and laterally spaced apart ring-like non-metallic electrodes, particularly at least three spaced apart ring-like non-metallic electrodes, more particularly at least four spaced apart ring-like non-metallic electrodes. Each of the ring-like non-metallic electrodes is electrically connected to a respective doping region by at least one, particularly by at least two, more particularly by at least three metallic plugs 140. The shortest distance d between any two metallic plugs 140 of any two different ring-like non-metallic electrodes 120 is larger than the shortest distance dl between the inner metallic ring-like electrode 172 and the outer ring-like metallic electrode 170, particularly at least twice as large, and more particularly at least three times as large.

According to an embodiment, the non-metallic electrodes 120 are provided only with the metallic plugs 140 in the area defined between the inner metallic ring-like electrode 172 and the outer metallic ring-like electrode 170. Further metallic structures are not formed on the non-metallic electrodes 120.

According to an embodiment, the metallic electrodes 170, 172 and the metallic plugs 140 are formed of the same metallic material containing, as main component, a metal, a metal alloy, or a stack of at least two metallic layers each containing as main component a metal or a metal alloy. Typically, metallic electrodes, or each of the metallic layers forming the metallic electrodes, contain at least 65 wt. % of metal or metal alloy, particularly at least 85 wt. % of metal or metal alloy such as at least 95 wt. % of metal or metal alloy.

What is claimed is:

1. A power semiconductor device, comprising:
   a semiconductor substrate comprising a central area defining an active region of the semiconductor device and a peripheral area between the central area and a lateral rim of the semiconductor substrate, the peripheral area defining an edge termination region of the semiconductor device;
   a plurality of non-metallic electrodes extending in the edge termination region on a front side of the semiconductor substrate, the plurality of non-metallic electrodes comprising at least three non-metallic electrodes being spaced apart from each other, wherein one of the non-metallic electrodes is an inner non-metallic electrode having an inner edge and another one of the non-metallic electrodes is an outer non-metallic electrode having an outer edge, wherein a shortest distance between the inner edge of the inner non-metallic electrode and the outer edge of the outer non-metallic electrode is defined as distance p;
   an electrically insulating bottom layer arranged between the semiconductor substrate and the plurality of non-metallic electrodes; and
   an electrically insulating cover layer on and in contact with an upper surface of the plurality of non-metallic electrodes,
   wherein each of the non-metallic electrodes is electrically connected to a respective doping region of the semiconductor substrate by at least two respective metallic plugs each extending through a respective first opening formed in the electrically insulating bottom layer,
   wherein a shortest distance d between any two of the metallic plugs of different non-metallic electrodes is larger than the distance p.

2. The power semiconductor device of claim 1, wherein the shortest distance d between any two of the metallic plugs of different non-metallic electrodes is at least two or three times as large as the distance p.

3. The power semiconductor device of claim 1, wherein the plurality of non-metallic electrodes comprises at least four non-metallic electrodes arranged next to and being spaced from each other, and wherein the shortest distance d between any of the at least two metallic plugs of one of the non-metallic electrodes and any of the at least two metallic plugs of another one of the non-metallic electrodes is at least two or three times as large as the distance p.

4. The power semiconductor device of claim 1, wherein the respective first opening of the electrically insulating bottom layer, an opening of the respective non-metallic electrode, and a respective first opening of the electrically insulating cover layer together form a through hole through which a respective one of the metallic plugs extends to come into ohmic contact with the respective doping region of the semiconductor substrate, and wherein the electrically insulating cover layer is arranged between the respective non-metallic electrode and the respective metallic plug in the through hole.

5. The power semiconductor device of claim 1, further comprising a passivation layer on the respective metal plugs and the electrically insulating cover layer.

6. The power semiconductor device of claim 1, wherein each of the non-metallic electrodes is arranged above and extends along a respective one of the doping regions, and wherein each doping region is of a second conductivity type and forms a respective pn-junction with a drift region of a first conductivity type.

7. The power semiconductor device of claim 1, further comprising a front metallization arranged in the active region of the semiconductor device, wherein no metal structures are arranged on and in contact with the electrodes in the edge termination region except for the metal plugs.

8. The power semiconductor device of claim 1, further comprising a non-metallic channel stopper electrode arranged between the plurality of the non-metallic electrodes and the lateral rim of the semiconductor substrate, and a metallic channel stopper ring, wherein the channel stopper electrode and the metallic channel stopper ring are in electrical contact with each other.

9. A power semiconductor device, comprising:
a semiconductor substrate comprising a central area defining an active region of the semiconductor device and a peripheral area between the central area and a lateral rim of the semiconductor substrate, the peripheral area defining an edge termination region of the semiconductor device, the edge termination region comprising straight portions and curved portions;
a plurality of non-metallic electrodes formed in the edge termination region on a front side of the semiconductor substrate, the plurality of non-metallic electrodes extending in the straight portions and the curved portions of the edge termination region;
an electrically insulating bottom layer arranged between the semiconductor substrate and the plurality of non-metallic electrodes; and
an electrically insulating cover layer on and in contact with an upper surface of the plurality of non-metallic electrodes,
wherein each of the non-metallic electrodes is electrically connected to a respective doping region, which is formed in the semiconductor substrate in the edge termination region, by a respective metallic plug,
wherein at least one of the metallic plugs of each of the non-metallic electrodes is formed in any of the straight portions of the edge termination region,
wherein the respective metallic plugs are distributed within a respective straight portion of the edge termination region at a mutual distance which is larger than a shortest distance p of an innermost edge and an outermost edge of the non-metallic electrodes.

10. The power semiconductor device of claim 9, wherein the respective metallic plugs are distributed within a respective straight portion of the edge termination region along a line which is inclined relative to a direction at which the non-metallic electrodes are spaced from each other.

11. The power semiconductor device of claim 9, wherein each of the non-metallic electrodes has a ring-like shape and completely surrounds the active region in a planar projection onto a front side of the semiconductor substrate.

12. The power semiconductor device of claim 9, wherein each of the metallic plugs comprises a first portion extending through a first opening of the electrically insulating cover layer and a first opening of the electrically insulating bottom layer to come into ohmic contact with the respective doping region, and a second portion extending through a second opening of the electrically insulating cover layer to come into ohmic contact with an upper surface of the respective non-metallic electrode.

13. The power semiconductor device of claim 12, wherein the electrically insulating bottom layer comprises respective second openings through which the respective non-metallic electrodes extend to come into ohmic contact with the respective doping regions.

14. The power semiconductor device of claim 9, wherein each of the non-metallic electrodes is arranged above and extends along a respective one of the doping regions, wherein each of the doping regions is of a second conductivity type and forms a respective pn-junction with a drift region of a first conductivity type.

15. The power semiconductor device of claim 9, further comprising a front metallization arranged in the active region of the semiconductor device, wherein no metal structures are arranged on the non-metallic electrodes in the edge termination region except for the metal plugs.

16. A power semiconductor device, comprising:
a semiconductor substrate comprising a central area defining an active region of the semiconductor device and a peripheral area between the central area and a lateral rim of the semiconductor substrate, the peripheral area defining an edge termination region of the semiconductor device;
an inner non-metallic electrode having an inner edge and an outer non-metallic electrode having an outer edge, wherein a shortest distance between the inner edge of the inner non-metallic electrode and the outer edge of the outer non-metallic electrode is defined as distance p, and wherein the inner non-metallic electrode and the outer non-metallic electrode are separate to and spaced apart from each other;
an electrically insulating bottom layer arranged between the semiconductor substrate and the inner and outer non-metallic electrodes; and
an electrically insulating cover layer on and in contact with an upper surface of the inner and outer non-metallic electrodes,
wherein the inner and outer non-metallic electrodes are electrically connected to respective doping regions of the semiconductor substrate by at least five respective metallic plugs each extending through a respective first opening formed in the electrically insulating bottom layer,
wherein a shortest distance d between any two of the metallic plugs is larger than the distance p.

17. The power semiconductor device of claim 16, wherein the inner and outer non-metallic electrodes are electrically connected to respective doping regions of the semiconductor substrate by at least seven respective metallic plugs each extending through a respective first opening formed in the electrically insulating bottom layer.

18. The power semiconductor device of claim 16, wherein each of the inner and outer non-metallic electrodes is a field plate formed on a first side of the semiconductor substrate.

19. The power semiconductor device of claim 16, wherein each of the inner and outer non-metallic electrodes comprises polysilicon as a main component.

* * * * *